United States Patent
Coteus et al.

(10) Patent No.: US 10,606,692 B2
(45) Date of Patent: Mar. 31, 2020

(54) ERROR CORRECTION POTENCY IMPROVEMENT VIA ADDED BURST BEATS IN A DRAM ACCESS CYCLE

(71) Applicant: International Business Machines Corporation, Armonk, NY (US)

(72) Inventors: Paul W. Coteus, Yorktown, NY (US); Kyu-hyoun Kim, Chappaqua, NY (US); Luis A. Lastras-Montano, Cortlandt Manor, NY (US); Warren E. Maule, Cedar Park, TX (US); Patrick J. Meaney, Poughkeepsie, NY (US); James A. O'Connor, Ulster Park, NY (US); Barry M. Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/849,396

(22) Filed: Dec. 20, 2017

(65) Prior Publication Data
US 2019/0188074 A1    Jun. 20, 2019

(51) Int. Cl.
*G06F 11/10* (2006.01)
*G11C 29/52* (2006.01)
*G11C 7/10* (2006.01)
*G11C 29/04* (2006.01)

(52) U.S. Cl.
CPC ...... *G06F 11/1008* (2013.01); *G06F 11/1012* (2013.01); *G06F 11/1044* (2013.01); *G06F 11/1064* (2013.01); *G11C 7/1018* (2013.01); *G11C 29/52* (2013.01); *G11C 2029/0411* (2013.01)

(58) Field of Classification Search
CPC .......................... G06F 11/1008; G11C 29/52
See application file for complete search history.

(56) References Cited

U.S. PATENT DOCUMENTS

| 5,896,404 A | * | 4/1999 | Kellogg | ............... G06F 11/1008 714/763 |
| 7,089,375 B2 | | 8/2006 | Pawlowski | |

(Continued)

OTHER PUBLICATIONS

Aniruddha N. Udipi et al., "LOT-ECC: Localized and Tiered Reliability Mechanisms for Commodity Memory Systems," Proceedings of the 39th Annual International Symposium on Computer Architecture (ISCA '12), p. 285-296, Jun. 2012.

(Continued)

*Primary Examiner* — Joseph D Torres
(74) *Attorney, Agent, or Firm* — Daniel P. Morris, Esq.; Hoffman & Baron, LLP

(57) ABSTRACT

An embodiment includes a method for use in operating a memory chip, the method comprising: operating the memory chip with an increased burst length relative to a standard burst length of the memory chip; and using the increased burst length to access metadata during a given operation of the memory chip. Another embodiment includes a memory module, comprising a plurality of memory chips, each memory chip being operable with an increased burst length relative to a standard burst length of the memory chip, the increased burst length being used to access metadata during a given operation of the memory module.

14 Claims, 6 Drawing Sheets

(56) References Cited

U.S. PATENT DOCUMENTS

| | | | |
|---|---|---|---|
| 7,451,380 B2* | 11/2008 | Carnevale | G06F 11/1044 714/766 |
| 7,584,308 B2* | 9/2009 | Gower | G06F 13/161 710/35 |
| 8,019,913 B2 | 9/2011 | Johnson | |
| 9,092,330 B2* | 7/2015 | Gilda | G06F 11/073 |
| 9,600,359 B2 | 3/2017 | Udipi et al. | |
| 2009/0006900 A1* | 1/2009 | Lastras-Montano | G06F 11/1044 714/42 |
| 2009/0168525 A1* | 7/2009 | Olbrich | G06F 13/1657 365/185.11 |
| 2010/0269021 A1 | 10/2010 | Gower et al. | |
| 2011/0016278 A1* | 1/2011 | Ware | G06F 13/1684 711/148 |
| 2014/0250268 A1* | 9/2014 | Traut | G06F 12/0862 711/113 |
| 2016/0147600 A1 | 5/2016 | Gao et al. | |
| 2016/0224414 A1 | 8/2016 | Trombley et al. | |
| 2017/0285992 A1* | 10/2017 | Vogt | G06F 13/16 |

OTHER PUBLICATIONS

Hyeran Jeon et al., "Efficient RAS support for 3D Die-Stacked DRAM," University of Southern California (USC) Viterbi School of Engineering, Computer Engineering Division Technical Report CENG-2014-02, 12 pages, 2014, http://ceng.usc.edu/assets/004/90108.pdf.

Aniruddha N. Udipi et al., "Rethinking DRAM Design and Organization for Energy-Constrained Multi-Cores," Proceedings of the 37th Annual International Symposium on Computer Architecture (ISCA '10), p. 285-296, Jun. 2010.

Jean-Paul Goemaere, "Reliability, Availability and Serviceability for zEnterprise," 58 pages, Sep. 2010, ftp://www.redbooks.ibm.com/redbooks/2010_ITSO_Total_Solution_Event_System_z_Brussels/2010_BRU_Track_3_System_z_and_zOS_Update_-_Technical_deep_dive_topics_zEnterprise/ZS13_-_RAS_for_zEnterprise.pdf.

Emily Desjardins, "JEDEC DDR5 & NVDIMM-P Standards Under Development," 3 pages, Mar. 2017, https://www.jedec.org/news/pressreleases/jedec-ddr5-nvdimm-p-standards-under-development.

"Double Data Rate," Wikipedia, https://en.wikipedia.org/wiki/Double_data_rate, 2009, pp. 1-2.

* cited by examiner

FIG. 5

| ROW | X4 DRAM CHIPS PER DIMM & BURST LENGTH | DIMM CAPACITY PER ACCESS | 1 DIMM ECC STRUCTURE | 2 DIMM ECC STRUCTURE | 4 DIMM ECC STRUCTURE | 5 DIMM RAIM ECC STRUCTURE |
|---|---|---|---|---|---|---|
| 510 | 8 X4 DRAM CHIPS BURST LENGTH 16 | 64 BYTES | 64 DATA BYTES 0 ECC BYTES | 128 DATA BYTES 0 ECC BYTES | 256 DATA BYTES 0 ECC BYTES | 256 DATA BYTES + 64 ECC BYTES |
| 520 | 9 X4 DRAM CHIPS BURST LENGTH 16 | 72 BYTES | 64 DATA BYTES 8 ECC BYTES | 128 DATA BYTES 16 ECC BYTES | 256 DATA BYTES 32 ECC BYTES | 256 DATA BYTES 32+72 = 104 ECC BYTES |
| 530 | 10 X4 DRAM CHIPS BURST LENGTH 16 | 80 BYTES | 64 DATA BYTES 8+8 = 16 ECC BYTES | 128 DATA BYTES 32 ECC BYTES | 256 DATA BYTES 64 ECC BYTES | 256 DATA BYTES 64+80 = 144 ECC BYTES |
| 540 | 9 X4 DRAM CHIPS BURST LENGTH 18 | 81 BYTES | 64 DATA BYTES 8+9 = 17 ECC BYTES | 128 DATA BYTES 34 ECC BYTES | 256 DATA BYTES 68 ECC BYTES | 256 DATA BYTES 68+81 = 149 ECC BYTES |
| 550 | 9 X4 DRAM CHIPS BURST LENGTH 17 | 76.5 BYTES | 64 DATA BYTES 8+4.5 = 12.5 ECC BYTES | 128 DATA BYTES 25 ECC BYTES | 256 DATA BYTES 50 ECC BYTES | 256 DATA BYTES 50+76.5 = 126.5 ECC BYTES |
| 560 | 8 X4 DRAM CHIPS BURST LENGTH 18 | 72 BYTES | 64 DATA BYTES 8 ECC BYTES | 128 DATA BYTES 16 ECC BYTES | 256 DATA BYTES 32 ECC BYTES | 256 DATA BYTES 32+72 = 104 ECC BYTES |
| 570 | 8 X4 DRAM CHIPS BURST LENGTH 17 | 68 BYTES | 64 DATA BYTES 4 ECC BYTES | 128 DATA BYTES 8 ECC BYTES | 256 DATA BYTES 16 ECC BYTES | 256 DATA BYTES 16+68 = 84 ECC BYTES |
| 580 | 10 X4 DRAM CHIPS BURST LENGTH 17 | 85 BYTES | 64 DATA BYTES 16+5 = 21 ECC BYTES | 128 DATA BYTES 42 ECC BYTES | 256 DATA BYTES 84 ECC BYTES | 256 DATA BYTES 84+85 = 169 ECC BYTES |
| 590 | 10 X4 DRAM CHIPS BURST LENGTH 18 | 90 BYTES | 64 DATA BYTES 16+10 = 26 ECC BYTES | 128 DATA BYTES 52 ECC BYTES | 256 DATA BYTES 104 ECC BYTES | 256 DATA BYTES 104+90 = 194 ECC BYTES |

# ERROR CORRECTION POTENCY IMPROVEMENT VIA ADDED BURST BEATS IN A DRAM ACCESS CYCLE

BACKGROUND

The present invention relates to the electrical, electronic and computer arts, and, more particularly, to operation of one or more memory chips.

Computers often include one or more DIMMs (dual in-line memory modules) having SDRAM (synchronous dynamic random-access memory) chips (i.e., integrated circuits) mounted thereon. SDRAM chips (and, by extension, DIMMs) are usually classified either as "×8," with each SDRAM chip having 8 DQs (data lines), or as "×4," with each SDRAM chip having 4 DQs. Burst length refers to the number of bits read or written to each DQ of an SDRAM chip during any access.

Computers often include trillions of bits of RAM (random-access memory). Yet, an unmitigated error in even a single one of these bits can cause an application or computer to crash, and in some cases render the entire computer inoperable until it is repaired using spare parts, which can entail significant down time. Thus, the probability of encountering a RAM failure during normal operations increases as computers grow more powerful and include more RAM. Moreover, the device size on RAM chips has grown smaller, such that circuit sizes are approaching physical limits, resulting in new failure modes such as variable retention time errors.

Accordingly, it has become increasingly common for RAM to store ECC (error correction code) symbols in addition to data words. By way of example, many DIMMs provide a 72-bit interface composed of 64 data bits and 8 ECC checksum bits, thereby allowing the use of a (72,64) Hamming code for SEC/DED (single error correction, double error detection). However, SEC/DED only permits correction of a single-bit permanent (hard) or transient (soft) error within a given data word.

However, SEC/DED cannot correct any errors affecting multiple bits in a given data word, such as those caused by failure of one of the RAM chips on a DIMM (e.g., a "chip kill"). Indeed, it would be desirable for a system to be sufficiently robust to survive failure of multiple RAM chips on a DIMM (e.g., a "double chip kill") or even failure of an entire DIMM (e.g., a "DIMM kill"). Preferably, the system can survive these catastrophic failures by either allowing for replacement of failed parts concurrent with system operation or providing sufficient resilience and redundancy so the system can remain fully operational and no repair is necessary.

However, the number of errors that can be detected and corrected is directly related to the length of the ECC field appended to the data word. The aforementioned SEC/DED only permits correction of a single-bit permanent (hard) or transient (soft) error within a given data word, yet reduces computer usable memory space by ~11% (8 bits out of 72 bits) to facilitate storage of the ECC.

By contrast, more powerful error correction and recovery techniques often entail additional loss of customer usable storage space (e.g., to hold longer ECCs). For example, memory mirroring is a relatively simple approach which involves keeping duplicate copies of data on two or more different devices (e.g., different chips and/or different DIMMs). Mirroring enables a system to survive catastrophic memory failures, but acceptance has been very low because it requires doubling error-correction memory requirements even beyond those necessitated by the base SEC/DED ECC (e.g., the aforementioned 11%), such that mirroring leaves customers with less than 50% of the available RAM usable for the customer's software.

DDR (dual data rate) collectively refers to a series of standards for SDRAM promulgated by the Joint Electron Device Engineering Council (JEDEC) Solid State Technology Association. Successive generations of DDR memory often seek to improve performance by increasing the standard burst length, thus increasing the number of data symbols supplied during any access. For example, DDR1 was published in 2000, with a standard burst length of 2. Thus, each DDR1 ×4 chip supplies 2 nibbles (2×4 bits) on each access, while each DDR1 ×8 chip supplies 2 bytes (2×8 bits) on each access. DDR2 was published in 2003, and increased the standard burst length to 4. DDR3 was published in 2007, and DDR4 was published in 2014, both with a standard burst length of 8. However, increased burst length means that failure of a SDRAM chip will affect a greater number of symbols. The more data and ECC symbols that are lost during a failure, the more total ECC symbols are needed to correct and recover the missing data.

As previously noted, many DIMMs provide a 72-bit interface composed of 64 data bits and 8 metadata (e.g., ECC checksum) bits. A DDR3 or DDR4 DIMM containing 9 ×8 chips—8 data chips and 1 checksum chip—will support 64 bytes of data and 8 bytes of checksum metadata. However, ×4 chips provide half of the data per access as ×8 chips, so twice as many ×4 chips are required to provide the 72-bit DIMM interface. Thus, a DDR3 or DDR4 DIMM constructed with ×4 chips will require 16 data chips and 2 checksum chips in order to support 64 bytes of data and 8 bytes of checksum metadata.

The storage capacity for ×8 and ×4 chips is the same, such that doubling the number of ×4 chips relative to ×8 chips will in turn double the total storage capacity for the DIMM. However, as noted above, ×4 DIMMs have twice as many chips as ×8 DIMMs, and therefore a chip failure in a ×4 DIMM will affect only half as many bits as a chip failure in a ×8 DIMM. Moreover, it is typically not possible to provide chip-kill correction in a ×8 DIMM with only one checksum DRAM because if any of the DRAMs fail completely too many symbols of the code word are lost to allow for chip-kill correction thus the data is lost. Thus, with all else equal, a ×4 chip kill is easier to recover from than a ×8 chip kill because only half as many bits are in errors for the ×4 chip. The more data and ECC symbols that are lost during a failure, the more total ECC symbols are needed to correct and recover the missing data.

Even though successive generations of DDR memory have increased burst length in order to increase memory bandwidth, there are countervailing constraints with respect to CPU (central processing unit) design. For example, it is often desirable to keep CPU architecture stable, which often has caused CPU cache line sizes to remain the same rather than keeping pace with the increasing memory burst length. In some cases, CPU cache line sizes have even shrunk, as the number of processor cores increases, in order to maintain and improve system performance characteristics.

A memory controller can spread data associated with a cache line over multiple DIMMs by simultaneously accessing multiple memory channels. Additionally and/or alternatively, each memory channel may be coupled to multiple DIMMs arranged in respective cascades. Utilizing multiple DIMMs across multiple memory channels tends to help increase bandwidth improving performance. Doubling the number of DIMMs utilized doubles the number of physical components which, with all else equal, will increase the error correction effectiveness. Thus, multi-channel designs also typically have better error correction characteristics because there are more data and checksum symbols to utilize on any access, which will result in stronger, more robust error correction codes. However, as DDR burst lengths increase, it can be difficult to maintain or shrink cache line size with multi-channel designs because more data is handled on every access.

In a single-rank DIMM, all DRAMs on the DIMM provide storage for a portion of the data during a given access. However, DIMMs can also be designed with multiple ranks. For example, a second rank could be added by doubling the number of DRAMs on a DIMM, thus doubling the storage capacity of the DIMM. Because only one rank at a time is active on any access, additional ranks are like having multiple logical DIMMs reside on a single physical DIMM.

FIG. 1 is a simplified diagram showing a memory architecture found in the IBM System z mainframe commercially available from International Business Machines, the assignee of the present invention. As shown in FIG. 1, this architecture utilizes 5 memory channels accessed in unison. Note that in FIG. 1, MCU is the memory controller unit, and SN is a SuperNova memory buffer chip on each DIMM coupled to the DRAM chips on that DIMM. This architecture has a 256 byte cache line which, when used with ×8 DIMMs having a burst length of 8 (e.g., DDR3 or DDR4), can be segmented into 4 parts and distributed across 4 memory channels. The fifth memory channel is used to implement a feature known as RAIM (redundant array of independent memory) parity. Each memory access results in 64 bytes of data and 8 bytes of checksum (e.g., checkbits) from each of the first 4 memory channels, and an additional 72 bytes of checksum (e.g., RAIM parity) from the fifth memory channel. Thus, each memory access results in 256 (64×4) bytes of data and 104 (8×4+72) bytes of ECC checksum. This allows for a sufficient ECC strength to allow for single chip kill correction, double chip kill correction, full DIMM kill correction, or even a full memory channel failure.

However, other computer architectures are different from System z: some have smaller cache sizes that do not lend themselves to RAIM type collection. For example, IBM System p servers have a 128 byte cache line, while Intel ×86 servers typically have a 64 byte cache line. The systems also typically have fewer memory channels than the IBM System z. In fact, some newer designs employ single independent memory channel cache line access. Both System p and Intel ×86 systems cannot provide full DIMM kill correction without requiring mirroring. Intel ×86 systems cannot even provide single chip kill correction using industry-standard ×8 DRAM DIMMs; chip kill can sometime be provided with ×4 DRAM DIMMs, but often involves unusual modes of operation that adversely impact system performance.

SUMMARY

An embodiment includes a method for use in operating a memory chip, the method comprising: operating the memory chip with an increased burst length relative to a standard burst length of the memory chip; and using the increased burst length to access metadata during a given operation of the memory chip. Another embodiment includes a memory module, comprising a plurality of memory chips, each memory chip being operable with an increased burst length relative to a standard burst length of the memory chip, the increased burst length being used to access metadata during a given operation of the memory module.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, embodiments of the present invention advantageously provide for more robust error correction without requiring additional DRAM chips or additional DIMM connector pins.

These and other features and advantages of the present invention will become apparent from the following detailed description of illustrative embodiments thereof, which is to be read in connection with the accompanying drawings.

BRIEF DESCRIPTION OF THE DRAWINGS

FIG. 5 is a table summarizing error correction capabilities with different numbers of ×4 DRAM chips and different burst lengths.

DETAILED DESCRIPTION

Figure 1:
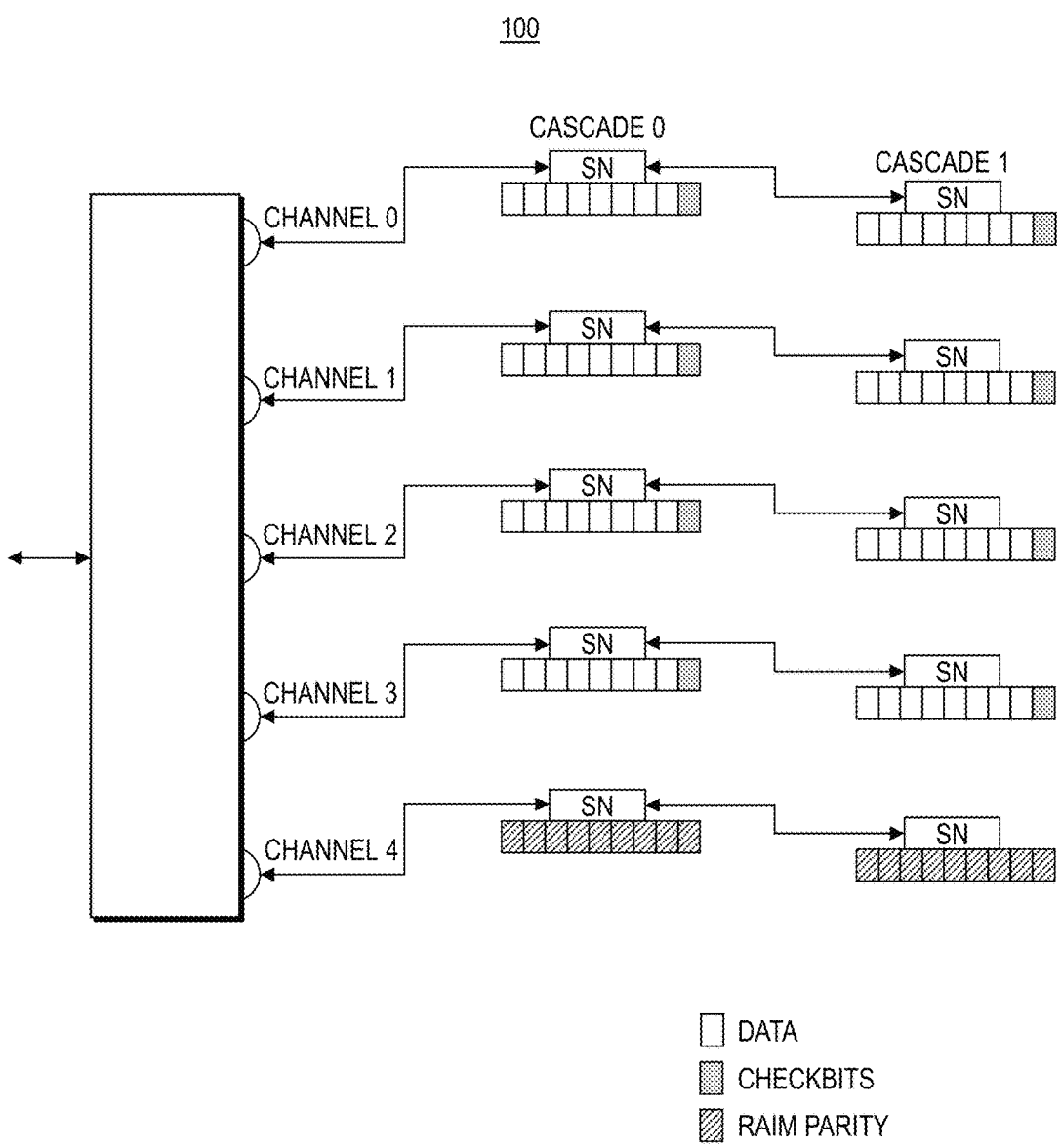
FIG. 1 is a simplified diagram showing a memory architecture found in the IBM System z mainframe commercially available from International Business Machines.

DDR5 is currently undergoing development, and has not yet been published, but will presumably have a standard burst length of 16. Assuming this is the case, a DDR5 ×4 chip will supply 8 bytes (16×4 bits) on each access and a DDR5 ×8 chip will supply 16 bytes (16×8 bits) on each access. Thus, a dual in-line memory module (DIMM) containing 9 DDR5 ×8 chips (with a burst of 16) will support 128 bytes of data and 16 bytes of metadata on each access, while a DIMM containing 9 DDR5 ×4 chips will support 64 bytes of data and 8 bytes of metadata on each access.

Doubling the burst length from 8 beats to 16 presents a significant new challenge associated with error correction robustness, such that a new DIMM structure will be necessary to maintain full memory channel and DIMM error correction. The challenge in maintaining error correction robustness with DDR5 is that, with all else equal, doubling the burst length doubles the amount of data written or read during each DRAM chip access. Since the structure and architecture of the underlying computer server systems that utilize this data is the same, only half the number of DRAM parts are needed to supply the same amount of data. While this improves the level of integration, it also means that when a full DRAM chip failure is encountered twice as many data and error correction code (ECC) checksum symbols are lost. Thus the error correction robustness is substantially degraded unless new innovative design enhancements can be crafted to mitigate this weakness.

Figure 2:
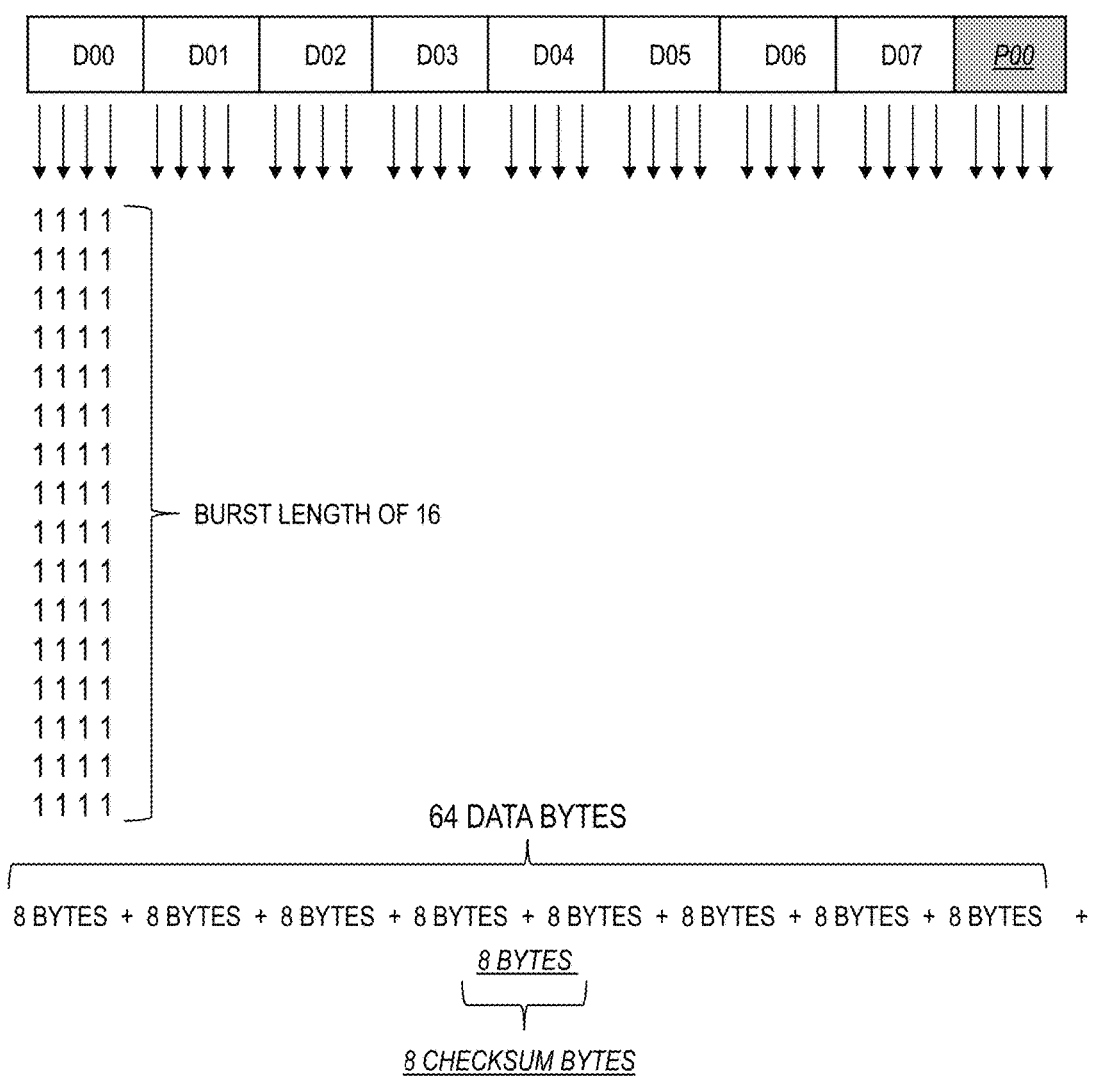
FIG. 2 illustrates single data access for DIMM with 9 ×4 DRAM chips and burst length 16.

FIG. 2 illustrates single data access for DIMM with 9 ×4 DRAM chips and burst length 16. In this arrangement, each rank of the DIMM is composed of 9 ×4 DRAM chips (data chips D0-D7 and parity chip P0), each of which stores 8 bytes. Thus, with this 9 chip DIMM structure, any read or write operation involves 64 bytes of data and 8 bytes of metadata, such as error correction code checksum symbols. If a cache line is just 64 bytes in length, as is typical with the Intel ×86 architecture, the entire cache line can be stored on a single DIMM. Assuming the symbol size is 1 byte, in the event of a full DRAM failure, 8 byte symbols are lost. Normally to correct for 8 independent symbol errors, one would need a code word with 16 error correction checksum symbols added to it. In this case the 9th DRAM chip provides for only 8 checksum symbols to be added to the code word, which is insufficient to correct for a DRAM chip kill failure. There are other techniques such as fault marking, where it would be possible to design error correction that requires less than 16 checksum symbols, but even applying these other techniques it is still not possible to provide chip kill correction for this structure of 64 data symbols with a code word with only 8 ECC checksum symbols.

Figure 3:
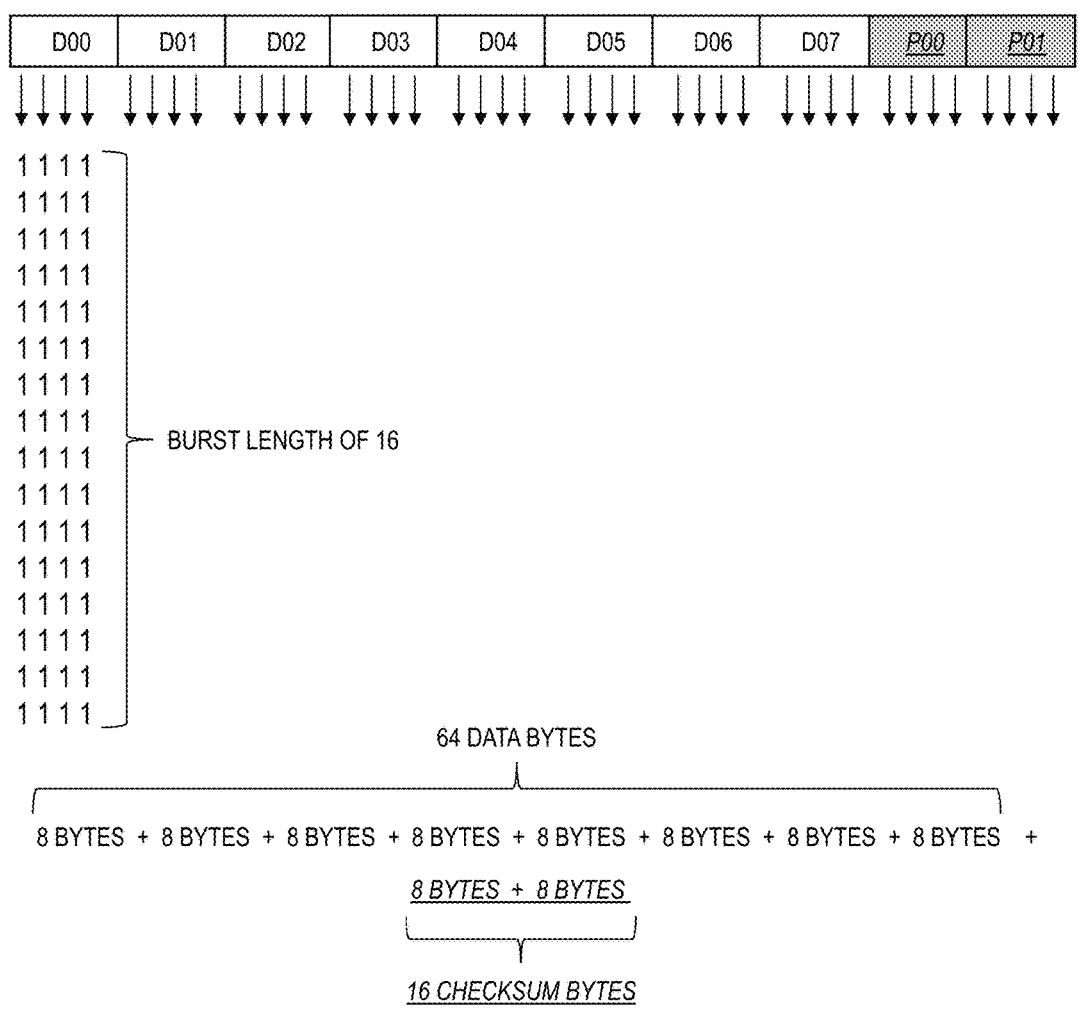
FIG. 3 illustrates single data access for DIMM with 10 ×4 DRAM chips and burst length 16.

FIG. 3 illustrates single data access for DIMM with 10 ×4 DRAM chips and burst length 16. This design utilizes 8 ×4 DRAM chips to store 64 Bytes of data, as with FIG. 2. However, instead of simply incorporating a single 9th ×4 chip to hold 8 bytes of checksum data on the DIMM, a 10th chip is added to provide an additional 8 bytes of checksum data: 16 checksum bytes per DIMM rank in total. Again assuming that symbols are 1 byte in length, it would be possible to locate and correct 8 independent symbol errors with a code word where 16 ECC checksum symbols are added to the 64 data symbols. This would provide sufficient symbol isolation and correction in the event of a chip kill that would result in 8 bytes in error. This design supports full error correction on a single ×4 DRAM DIMM and with marking can provide correction beyond a full chip kill which is important because single bit errors can align with a chip kill and have to be handled in conjunction with chip kills too. However, there has been resistance to adding a 10th DRAM chip to industry standard DIMMs since the 10th chip adds power and cost to the DIMM, while many lower end servers and computers do not require chip kill correction.

Another possibility would use a DIMM composed of 9 ×4 DRAM chips, but then adds a 5th DQ pin to each ×4 DRAM chip. In this arrangement a subset of the DRAM chips on the DIMM would provide 2 extra bits per 16 burst access to increase the number of checksum symbols and thus improve ECC effectiveness without additional DRAM chips and while allowing a burst length of 16 to be maintained. DIMM connector pins are in short supply so any design modifications that increase the number of connector pins is problematic. Thus this design only utilizes a portion of the 5th DQ bits from a subset of the DRAM chips on the DIMM. Only 4 of the 9 DRAM chips use the 5th DQ and thus require only the same number of additional DIMM connector pins as addition of a 10th DRAM chip would. However, this approach would provide an additional single Byte checksum symbol whereas adding a 10th DRAM chip would provide 8 additional bytes. Another downside to this approach is that it also takes away some of the customer usable cells on the DRAM chip which would now be used to hold checksum symbol data. The addition of the 10th DRAM chip does not require this tradeoff since the additional checksums are stored on the added 10th DRAM chip.

In contrast to the aforementioned arrangements, embodiments of the present invention advantageously provide for more robust error correction without requiring additional DRAM chips or additional DIMM connector pins. Instead, embodiments of the present invention increase the burst length, and use the additional cycles of the burst to provide additional metadata, such as additional ECC check symbols. As burst length increases, the performance penalty associated with using additional burst cycles to provide ECC checksums becomes less significant. For a burst length of 4, as in DDR2, adding just one cycle to the burst represents a 25% increase in burst length and thus could noticeably impact access time. For a burst length of 8, as in DDR3 and DDR4, adding an extra cycle represents a 12.5% increase and for a burst length of 16, as in DDR5, an extra cycle represents just a 6.25% increase, such that bandwidth requirements can still be satisfied while improving RAS (reliability, availability, and serviceability).

Figure 4:
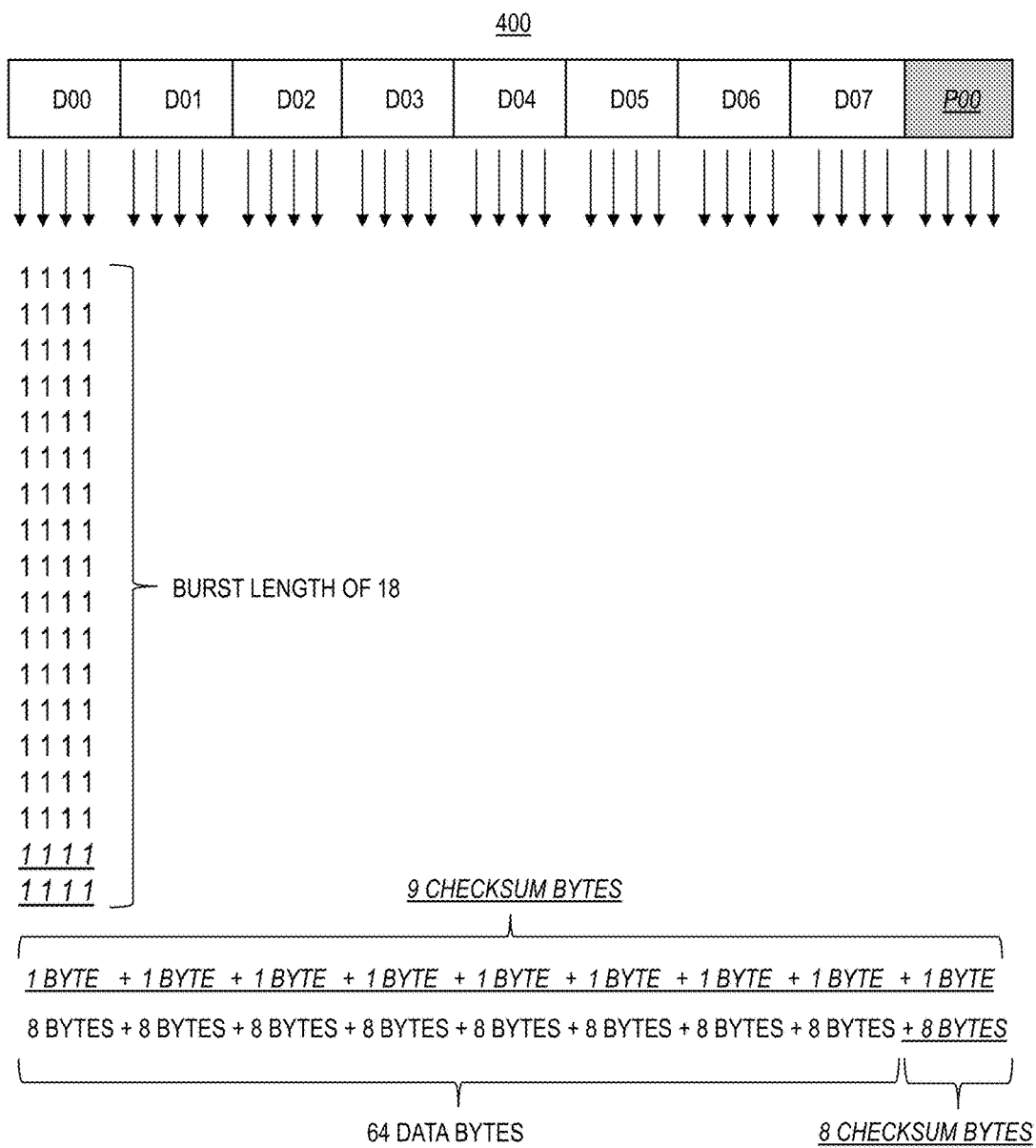
FIG. 4 illustrates single data access for DIMM with 9 ×4 DRAM chips and burst length 18.

FIG. 4 illustrates single data access for DIMM with 9 ×4 DRAM chips and burst length 18. As with FIG. 2, this design includes 8 ×4 DRAM chips (D0-D7) storing 64 bytes of data, and a 9th ×4 chip (P0) storing 8 bytes of metadata, such as ECC checksum data. However, this design also uses the 2 additional cycles within each burst to read an extra byte (2 bits per cycle) from each of the 9 ×4 DRAM chip, thus outputting an additional 9 bytes of metadata, such as ECC checksum data. Thus, the FIG. 4 arrangement results in a total of 64 bytes of data and 17 bytes of checksum on each DIMM access. It should be noted that with a burst of 16, a chip kill failure results in 8 bytes being lost in the code word while with a burst of 18, a chip kill failure results in 9 bytes in error.

FIG. 5 is a table summarizing error correction capabilities with different numbers of ×4 DRAM chips and different burst lengths. The configurations in each row 510-570 are analyzed with respect to 1 DIMM, 2 DIMM, and 4 DIMM structures, as well as a 5 DIMM RAIM structure similar to that discussed above with reference to FIG. 1. The 1 DIMM structure may be useful for an Intel ×86 or other processor having a 64 byte cache line. The 2 DIMM structure may be useful for an IBM System p or other processor having a 128 byte cache line. The 4 DIMM structure (or 5 DIMM RAIM structure) may be useful for an IBM System z or other processor having a 256 byte cache line. While FIG. 5 only discusses ×4 DRAM chips, one skilled in the art would understand that inventive techniques could be applied to other DRAM chips, such as ×8 DRAM chips.

Rows 510-530 show arrangements with a burst size of 16. Row 510 uses 8 ×4 DRAM chips per DIMM with a burst size of 16, thus accessing 64 bytes per DIMM. Because there are no additional chips for metadata storage, such arrangements do not allow for any ECC, except in the 5 DIMM RAIM structure, which as discussed above with reference to FIG. 1 includes an additional DIMM for storage of 64 bytes of metadata, such as ECC checksum data.

Row 520 uses 9 ×4 DRAM chips per DIMM with a burst size of 16, thus accessing 72 bytes per DIMM. As discussed above with reference to FIG. 2, a 1 DIMM structure provides 64 data bytes and 8 ECC bytes. A 2 DIMM structure provides 128 data bytes and 16 ECC bytes, while a 4 DIMM structure provides 256 data bytes and 32 ECC bytes. The 5 DIMM RAIM structure provides 32 ECC bytes from the first 4 DIMMs, plus an additional 72 ECC bytes from the fifth DIMM, for a total of 104 ECC bytes.

Row 530 uses 10 ×4 DRAM chips per DIMM with a burst size of 16, thus accessing 80 bytes per DIMM. As discussed above with reference to FIG. 3, a 1 DIMM structure provides 64 data bytes and 16 ECC bytes. A 2 DIMM structure provides 128 data bytes and 32 ECC bytes, while a 4 DIMM structure provides 256 data bytes and 64 ECC bytes. The 5 DIMM RAIM structure provides 64 ECC bytes from the first 4 DIMMs, plus an additional 80 ECC bytes from the fifth DIMM, for a total of 104 ECC bytes.

Rows 540-590 show embodiments with increased burst sizes. Row 540 uses 9 ×4 DRAM chips per DIMM with a burst size of 18, thus accessing 81 bytes per DIMM. As discussed above with reference to FIG. 4, a 1 DIMM structure provides 64 data bytes and 17 ECC bytes: 64 data bytes from the first 8 DRAMs, 8 ECC bytes from the 9th DRAM, and 9 ECC bytes from the extra cycles. A 2 DIMM structure provides 128 data bytes and 34 ECC bytes, which would provide for isolation and correction of at least 2 DRAM chip kills. A 4 DIMM structure provides 256 data bytes and 68 ECC bytes, thus providing for isolation and correction of at least 3 DRAM chip kills. The 5 DIMM RAIM structure provides 68 ECC bytes from the first 4 DIMMs, plus an additional 81 ECC bytes from the fifth DIMM, for a total of 149 ECC bytes. Since 81 bytes are lost in the event of a DIMM failure, this structure would provide for a full DIMM failure isolation and correction.

Row 550 uses 9 ×4 DRAM chips per DIMM with a burst size of 17, thus accessing 76.5 bytes per DIMM. A 1 DIMM structure provides 64 data bytes from the first 8 DRAMs, 8 ECC bytes from the 9th DRAM, and 4.5 ECC bytes from the extra cycle for a total of 12.5 ECC bytes. A 2 DIMM structure provides 128 data bytes and 25 ECC bytes, which would provide for chip kill correction. A 4 DIMM structure provides 256 data bytes and 50 ECC bytes, which would provide for isolation and correction of at least 2 DRAM chip kills. The 5 DIMM RAIM structure provides 50 ECC bytes from the first 4 DIMMs, plus an additional 76.5 ECC bytes from the fifth DIMM, for a total of 126.5 ECC bytes.

Row 560 uses 8 ×4 DRAM chips per DIMM with a burst size of 18, thus accessing 72 bytes per DIMM. A 1 DIMM structure provides 64 data bytes, and 8 ECC bytes from the extra cycles, which could provide isolation and correction for at least 4 independent symbol errors without requiring additional chips. A 2 DIMM structure provides 128 data bytes and 16 ECC bytes. A 4 DIMM structure provides 256 data bytes and 32 ECC bytes, which would provide for isolation and correction of at least 2 DRAM chip kills. The 5 DIMM RAIM structure provides 32 ECC bytes from the first 4 DIMMs, plus an additional 72 ECC bytes from the fifth DIMM, for a total of 104 ECC bytes.

Row 570 uses 8 ×4 DRAM chips per DIMM with a burst size of 17, thus accessing 68 bytes per DIMM. A 1 DIMM structure provides 64 data bytes, and 4 ECC bytes from the extra cycle, which would allow for fault isolation and correction for at least 2 independent symbol errors while freeing up more cells for storing client data vs. checksum symbols. A 2 DIMM structure provides 128 data bytes and 8 ECC bytes, while a 4 DIMM structure provides 256 data bytes and 16 ECC bytes. The 5 DIMM RAIM structure provides 16 ECC bytes from the first 4 DIMMs, plus an additional 68 ECC bytes from the fifth DIMM, for a total of 84 ECC bytes.

Row 580 uses 10 ×4 DRAM chips per DIMM with a burst size of 17, thus accessing 85 bytes per DIMM. A 1 DIMM structure provides 64 data bytes from the first 8 DRAMs, 16 ECC bytes from the 9th and 10th DRAMs, and 5 ECC bytes from the extra cycle for a total of 21 ECC bytes. A 2 DIMM structure provides 128 data bytes and 42 ECC bytes, while a 4 DIMM structure provides 256 data bytes and 84 ECC bytes. The 5 DIMM RAIM structure provides 84 ECC bytes from the first 4 DIMMs, plus an additional 85 ECC bytes from the fifth DIMM, for a total of 169 ECC bytes.

Row 590 uses 10 ×4 DRAM chips per DIMM with a burst size of 18, thus accessing 90 bytes per DIMM. A 1 DIMM structure provides 64 data bytes from the first 8 DRAMs, 16 ECC bytes from the 9th and 10th DRAMs, and 10 ECC bytes from the extra cycles for a total of 26 ECC bytes. A 2 DIMM structure provides 128 data bytes and 52 ECC bytes, while a 4 DIMM structure provides 256 data bytes and 104 ECC bytes. The 5 DIMM RAIM structure provides 104 ECC bytes from the first 4 DIMMs, plus an additional 90 ECC bytes from the fifth DIMM, for a total of 194 ECC bytes.

Embodiments of the present invention may advantageously reduce the performance degradation associated with added burst length by immediately operating on the data which can be made fully available after the standard burst length, thereby reducing latency. For example, if the DDR5 burst length is increased from 16 to 18, all 64 bytes of data can be provided in the first 16 cycles of the burst, so that there is no need to wait for all 18 cycles to begin operating on the 64 bytes of data. Rather, the additional cycles merely delay accessing all of the checksum symbols needed to isolate and correct errors. However, errors are relatively rarely encountered. Thus, the data can be processed immediately upon receipt (e.g., after 16 cycles), and if the subsequently-received checksum indicates an error (e.g., after the 18th cycle), the pipeline can be interrupted to intercept the data and replace it with corrected data.

Embodiments of the present invention may include a DRAM chip design that supports a variety of burst lengths (e.g., 16 or 17 or 18) so that it would be more general purpose and usable in a wide variety of implementations. Thus, it may be desirable for a chip to be programmable to operate in at least 2 different modes (e.g., burst lengths of 16 and 18). Even a standard burst (e.g., 16 cycles for DDR5) can be used to hold checksum symbols in addition to data by adjusting the cache line size. For example, if 14 cycles were used for data symbols and 2 cycles were used for checksum symbols, then a DIMM with 8 ×4 DRAM chips could prove for 56 bytes of data and 8 checksum symbols.

Although FIG. 5 only discusses increasing a burst size from 16 to 17 or 18, the burst size could be further increased, e.g., to 19 or 20. Likewise, although FIG. 5 only discusses increasing a burst size for a DIMM having 8 or 9 DRAM chips, the burst size could be increased for DIMMs having a different number of chips, such as the 10-chip DIMM discussed with reference to FIG. 3 and row 530 in FIG. 5.

Finally, embodiments of the invention may be applied to memory chips having burst sizes other than 16: for example, a DDR3 or DDR4 DIMM could have its burst size increased from 8 to 9 or 10.

One or more embodiments of the invention, or elements thereof, can be implemented, at least in part, in the form of an apparatus including a memory and at least one processor that is coupled to the memory and operative to perform exemplary method steps.

Figure 6:
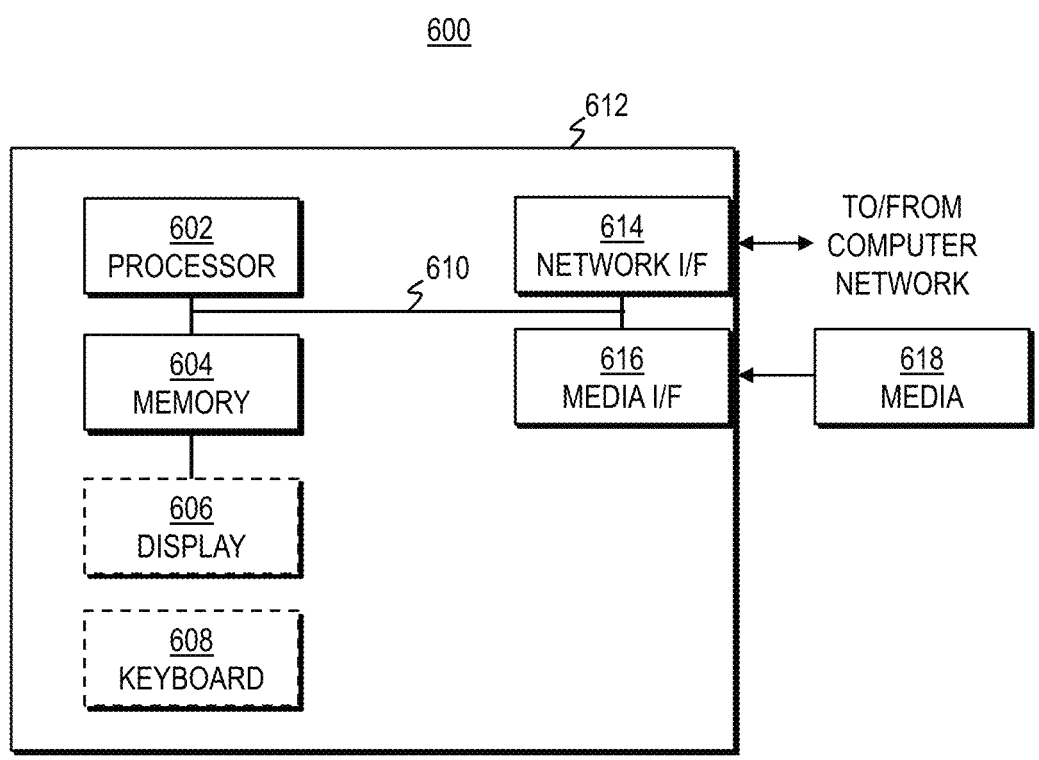
FIG. 6 depicts a computer system that may be useful in implementing one or more aspects and/or elements of the invention.

One or more embodiments can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein. The method steps can then be carried out using the distinct software modules and/or sub-modules of the system, as described above, executing on one or more hardware processors 602. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory module, comprising:
a plurality of memory chips, each of the memory chips being operable in one of at least first and second modes, the memory chips when operating in the first mode having an increased burst length relative to a standard burst length of the memory chips when operating in the second mode, the increased burst length being used to access metadata during a given operation of the memory module;
wherein the memory module is configured to correct at least one chip kill error affecting multiple bits in a given data word when at least a subset of the memory chips is operating in the first mode.

2. The memory module of claim 1, wherein when operated with the standard burst length, each of the plurality of memory chips of the memory module is used only for data rather than the metadata.

3. The memory module of claim 1, wherein when operated with the standard burst length, at least one of the plurality of memory chips of the memory module is used only for the metadata.

4. The memory module of claim 1, wherein the memory module is used only for the metadata.

5. The memory module of claim 1, wherein the memory module is part of a redundant array of independent memories (RAIM).

6. The memory module of claim 1, wherein the memory module is a dual in-line memory module (DIMM).

7. The memory module of claim 1, wherein each of the memory chips comprises a DDR5 SDRAM.

8. The memory module of claim 1, wherein the standard burst length of the memory chips is 16 beats.

9. The memory module of claim 1, wherein the increased burst length of the memory chips is 17 or 18 beats.

10. The memory module of claim 1, wherein the metadata comprises one or more error correction codes.

11. The memory module of claim 10, wherein the one or more error correction codes correspond to data accessed during the standard burst length when the memory chips are operating in the second mode.

12. The memory module of claim 11, wherein at least a subset of the memory chips is configured to begin processing the accessed data after the standard burst length of the memory chip and to interrupt the processing of the data after the increased burst length if the one or more error correction codes indicate an error in the data.

13. The memory module of claim 11, wherein for a given one of the memory chips operating in the second mode with the standard burst length, the metadata is not accessed.

14. The memory module of claim 1, wherein when a given one of the memory chips is operating in the second mode with the standard burst length, using a portion of the standard burst length for accessing one or more error correction codes corresponding to data accessed during another portion of the standard burst length.

\* \* \* \* \*